United States Patent
Schuegraf et al.

(10) Patent No.: US 6,444,591 B1
(45) Date of Patent: Sep. 3, 2002

(54) METHOD FOR REDUCING CONTAMINATION PRIOR TO EPITAXIAL GROWTH AND RELATED STRUCTURE

(75) Inventors: Klaus Schuegraf; David L. Chapek, both of Aliso Viejo, CA (US)

(73) Assignee: Newport Fab, LLC, Newport Beach, CA (US)

( * ) Notice: Subject to any disclaimer, the term of this patent is extended or adjusted under 35 U.S.C. 154(b) by 77 days.

(21) Appl. No.: 09/677,708

(22) Filed: Sep. 30, 2000

(51) Int. Cl.[7] .................. H01L 21/31; H01L 21/469; H01L 21/311; H01L 21/331
(52) U.S. Cl. .................. 438/762; 438/763; 438/644; 438/363; 438/312
(58) Field of Search .................. 438/694, 700, 438/309, 312, 350, 360, 359, 363, 362, 364, 689, 717, 734, 735, 736, 737, 740, 761, 762, 763

(56) References Cited

U.S. PATENT DOCUMENTS

| | | | |
|---|---|---|---|
| 5,274,266 A | * 12/1993 | Tews et al. | 257/592 |
| 5,939,738 A | * 8/1999 | Morris | 257/197 |
| 5,962,880 A | * 10/1999 | Oda et al. | 257/198 |
| 6,117,744 A | * 9/2000 | Ammo | 438/309 |
| 6,368,946 B1 | * 4/2002 | Dekker et al. | 438/488 |

OTHER PUBLICATIONS

Vook et al., Double–Diffused Graded SiGe–Base Bipolar Transistors, Jun. 1994, IEEE transactions on electron devices, vol. 41, No. 6, pp 1013–1018.*

Borland, Silicon Epitaxial Equipment and Processing Advances for Bipolar Base Technology Technology, 1992, IEEE Bipolar Circuits and Technology Meeting, pp 16–22.*

* cited by examiner

Primary Examiner—Richard Elms
Assistant Examiner—Adam Pyonin
(74) Attorney, Agent, or Firm—Farjami & Farjami LLP

(57) ABSTRACT

According to a disclosed embodiment, the surface of a semiconductor wafer is covered by an etch stop layer. For example, the etch stop layer can be composed of silicon dioxide. A cap layer is then fabricated over the etch stop layer. For example, the cap layer can be a polycrystalline silicon layer fabricated over the etch stop layer. The cap layer is then selectively etched down to the etch stop layer creating an opening in the cap layer according to a pattern. The pattern can be formed, for example, by covering the cap layer with photoresist and selective etching. Selective etching can be accomplished by using a dry etch process which etches the cap layer without substantially etching the etch stop layer. The etch stop layer is then removed using, for example, a hydrogen-fluoride cleaning process. A semiconductor crystal is then grown by epitaxial deposition in the opening. For example, the semiconductor crystal can be silicon-germanium. Moreover, a single crystal semiconductor structure of high quality, i.e. with virtually no crystal defects, can be formed according to one disclosed embodiment. For example, according to one embodiment, a high quality silicon-germanium base region of a heterojunction bipolar transistor can be formed on a silicon wafer.

16 Claims, 5 Drawing Sheets

NPN HBT

METHOD FOR REDUCING CONTAMINATION PRIOR TO EPITAXIAL GROWTH AND RELATED STRUCTURE

BACKGROUND OF THE INVENTION

1. Field of the Invention

The present invention relates to the field of fabrication of semiconductor devices. More specifically, the invention relates to the fabrication of silicon-germanium semiconductor devices.

2. Related Art

In a heterojunction bipolar transistor, or HBT, a thin silicon-germanium layer is grown as the base of a bipolar transistor on a silicon wafer. The silicon-germanium HBT has significant advantages in speed, frequency response, and gain when compared to a conventional silicon bipolar transistor. Speed and frequency response can be compared by the cutoff frequency which, simply stated, is the frequency where the gain of a transistor is drastically reduced. Cutoff frequencies in excess of 100 GHz have been achieved for the HBT, which are comparable to the more expensive GaAs. Previously, silicon-only devices have not been competitive for use where very high speed and frequency response are required.

The higher gain, speeds, and frequency response of the HBT have been achieved as a result of certain advantages of silicon-germanium not available with pure silicon, for example, narrower band gap, and reduced resistivity. Silicon-germanium may be epitaxially grown on silicon wafers using conventional silicon processing and tools, and allows one to engineer device properties such as the band gap, energy band structure, and mobilities. For example, it is known in the art that grading the concentration of germanium in the silicon-germanium base builds into the HBT device an electric field, which accelerates the carriers across the base, thereby increasing the speed of the HBT device compared to a silicon-only device. One method for fabricating silicon and silicon-germanium devices is by chemical vapor deposition ("CVD"). A reduced pressure chemical vapor deposition technique, or RPCVD, used to fabricate the HBT device allows for a controlled grading of germanium concentration across the base layer. As already noted, speeds in the range of approximately 100 GHz have been demonstrated for silicon-germanium devices, such as the HBT.

Epitaxial growth on a silicon surface of silicon-germanium that is sufficiently high quality to meet the demands of fabrication for devices such as the HBT demands that the silicon surface be as near as possible to a perfect crystal surface. Specifically, the silicon surface must not be contaminated. The presence of contaminants on the silicon surface cause defects to occur in the subsequent silicon-germanium crystal growth on top of that surface. For example, contaminants on the silicon surface at the start of epitaxial deposition can result in accelerated growth, referred to as a "spike." The height of a spike can be as great as the thickness of the epitaxial deposition. Such a spike can cause holes in photoresist and other subsequently deposited layers of material.

Because silicon-germanium integrates two dissimilar materials, defects compromise the crystalline quality regardless of the amount of germanium present. Defects cause even greater compromise in crystalline quality as the concentration of germanium increases in the silicon-germanium. Therefore, demands that the silicon surface be as near as possible to a perfect crystal surface become even stricter for silicon-germanium than for silicon-only devices.

The presence of contaminants on the silicon surface can adversely affect yield of the fabrication process, device performance, and device reliability. For example, defects due to contamination may cause the wafer to fail quality checks and inspections within the fabrication process resulting in fewer wafers completing the fabrication process and higher costs due to lower yield. Device performance can be changed, for example, by unwanted mobile ionic contaminants resulting in a device unsuitable for the use for which it was designed. Device reliability can be adversely affected, for example, by small amounts of metallic contaminants which can travel in the device and eventually cause failure. Therefore, it is important to control the presence of contaminants on the silicon surface in order to prevent adverse effects on yield, performance, and reliability of silicon-germanium devices.

Contaminants, which must be removed from the silicon surface, include particulate matter, organic residue, and inorganic residue. By way of example, particulate matter includes dust and smoke particles, as well as other impurities commonly found in the air, and bacteria that grow in water systems and on surfaces not cleaned regularly. Organic residues are chemical compounds containing carbon; for example, oils in fingerprints. Inorganic residues are chemical compounds not containing carbon; for example, hydrochloric acid or hydrofluoric acid which may be introduced from other steps in the wafer processing. As these examples indicate, the sources of contamination include materials which are omnipresent in the environment, such as carbon and oxygen, but also include other steps in the fabrication process, for example, chemical residue on RPCVD chamber walls or residual oxides from typical cleaning solvents such as peroxides.

One method for cleaning the wafer surface prior to epitaxial deposition processes is to employ a sequence of heated, peroxide-charged hydrochloric acid and ammonia hydroxide baths. Very harsh solvents can be used because the silicon surface is extremely resistant to almost all acids and bases. The silicon surface, however, will almost immediately react with and bind to impurities that are always present in the air and in aqueous solutions. By way of contrast, an oxygenated silicon surface (i.e. glass) is quite inert. Oxygen is therefore provided in the final step of the clean in order to form a glassy silicon oxide protective surface over the silicon surface. The silicon oxide protects the previously exposed silicon surface while the wafer is in transition from the cleaning area to the RPCVD chamber.

However, prior to subsequent epitaxial deposition, the protective silicon oxide and any residual silicon oxide must be removed from the silicon surface. One method, referred to as a "hydrogen bake," is that the protective silicon oxide and any residual silicon oxide can be evaporated from the silicon surface in the RPCVD chamber by heating the wafer to a temperature in a range of approximately 700° C. to 1100° C. for a period of approximately 5 to 30 minutes in a hydrogen atmosphere. The hydrogen desorbs residual contaminants present on the surface of the wafer during the hydrogen bake. The purpose of the hydrogen bake is to leave the silicon surface in the epitaxial deposition region completely free of contaminants.

One problem of the high temperature hydrogen bake arises from the fact that it permits opportunities for recontamination due to contaminants that migrate from other areas on the wafer to the silicon surface in the epitaxial deposition region. For example, contaminants can migrate at the elevated temperatures during the hydrogen bake from the isolation regions onto the epitaxial growth region.

Recontamination can result, for example, from contamination present from prior processing steps. Sources include residual contaminants on the RPCVD chamber walls or on the wafer itself or out-diffusion of dopants from the silicon substrate. Examples of contaminants include oxygen, water, and organo-metallic compounds that can contaminate oxides on the surface of the wafer such as isolation regions. Recontamination adversely affects the yield, performance, and reliability of silicon-germanium devices as discussed above.

Thus, there is need in the art to improve the yield for fabrication of silicon-germanium semiconductor devices, as well as device performance and reliability, by improving the methods used to control the presence of contaminants on the silicon surface prior to epitaxial growth of silicon-germanium.

SUMMARY OF THE INVENTION

The present invention is directed to method for reducing contamination prior to epitaxial growth and related structure. The invention overcomes the need in the art to improve the yield for fabrication of silicon-germanium semiconductor devices, as well as device performance and reliability, by improving the methods used to control the presence of contaminants on the silicon surface prior to epitaxial growth of silicon-germanium.

According to the invention the surface of a semiconductor wafer is covered by an etch stop layer. For example, the etch stop layer can be composed of silicon dioxide. A cap layer is then fabricated over the etch stop layer. For example, the cap layer can be a polycrystalline silicon layer fabricated over the etch stop layer. The cap layer is then selectively etched down to the etch stop layer creating an opening in the cap layer according to a pattern. The pattern can be formed, for example, by covering the cap layer with photoresist and selective etching. Selective etching can be accomplished by using a dry etch process which etches the cap layer without substantially etching the etch stop layer. The etch stop layer is then removed using, for example, a hydrogen-fluoride cleaning process. A semiconductor crystal is then grown by epitaxial deposition in the opening. For example, the semiconductor crystal can be silicon-germanium.

Moreover, a single crystal semiconductor structure of high quality, i.e. with virtually no crystal defects, can be formed according to one embodiment of the invention. For example, according to one embodiment, a high quality silicon-germanium base region of a heterojunction bipolar transistor can be formed on a silicon wafer.

DETAILED DESCRIPTION OF THE INVENTION

The present invention is directed to method for reducing contamination prior to epitaxial growth and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
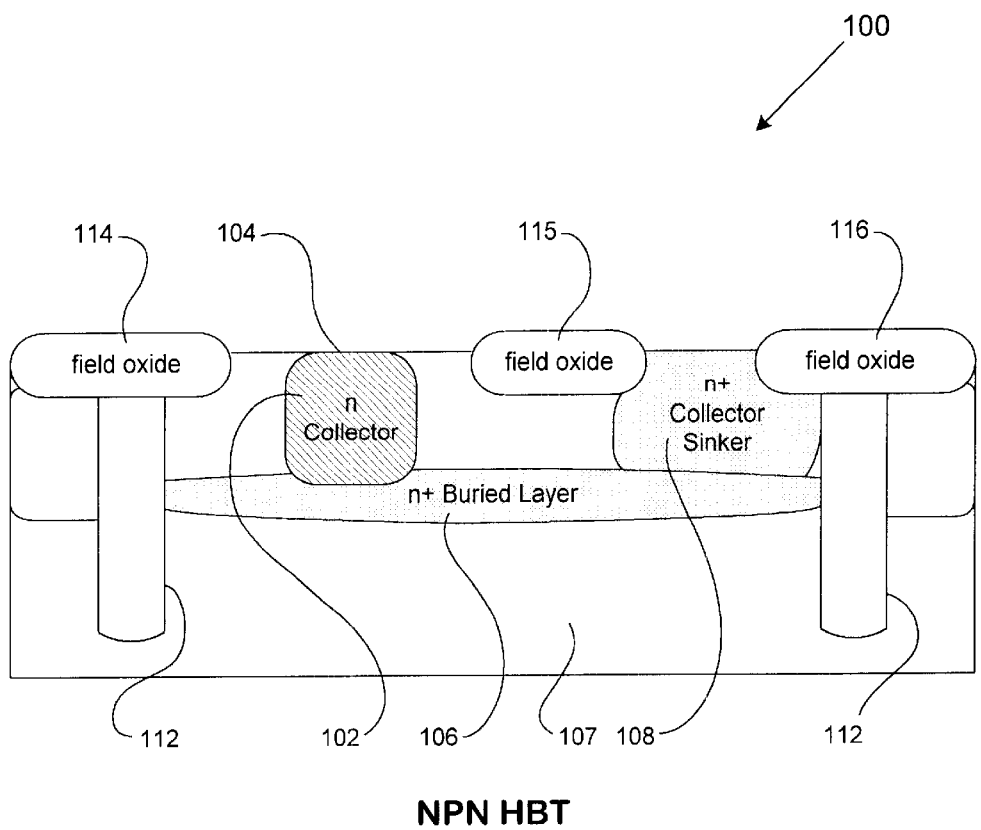
FIG. 1 illustrates a cross sectional view of some of the features of an NPN HBT prior to application of the steps taken to implement an embodiment of the present invention.

FIG. 1 shows exemplary structure 100 which is used to describe the present invention. Certain details and features have been left out of FIG. 1 which are apparent to a person of ordinary skill in the art. Structure 100 includes collector 102 for a silicon-germanium heterojunction bipolar transistor ("HBT"). Collector 102 is N-type single crystal silicon which can be formed using a dopant diffusion process in a manner known in the art. Collector 102 has a top surface 104. It is an object of one embodiment of the invention as described below to protect top surface 104 from recontamination during cleaning prior to epitaxial deposition, in an RPCVD process, of a base comprised of P-type silicon-germanium single crystal on top surface 104. By the addition of base and emitter and formation of junctions and other structures in a manner known in the art, an NPN HBT is formed which includes collector 102.

As seen in FIG. 1, buried layer 106, which is composed of N+ type material—meaning that it is relatively heavily doped N-type material—is formed in silicon substrate 107 in a manner known in the art. Collector sinker 108, also composed of N+ type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (the collector contact is not shown in any of the Figures). Deep trenches 112 and field oxide isolation regions 114, 115, and 116 composed of silicon oxide ($SiO_2$) material are formed in a manner known in the art. Deep trenches 112 and field oxide isolation regions 114, 115, and 116 provide electrical isolation from other devices on silicon substrate 107 in a manner known in the art. Thus FIG. 1 shows that structure 100 includes several features and components used to form an HBT at a stage prior to epitaxial deposition, in an RPCVD process, of a base comprised of P-type silicon-germanium single crystal on top surface 104 of collector 102.

Figure 2:
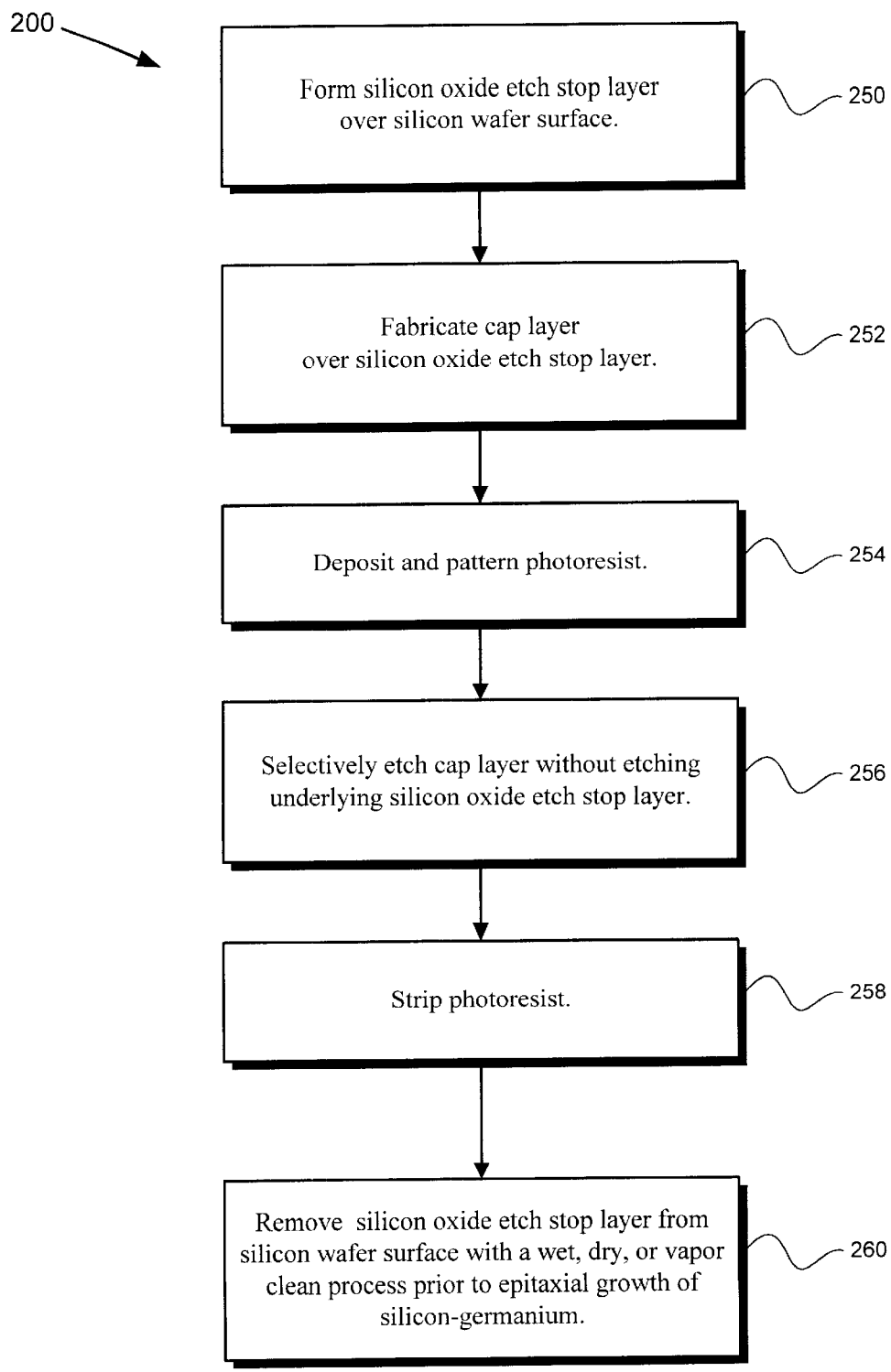
FIG. 2 shows a flowchart illustrating the steps taken to implement an embodiment of the present invention.

FIG. 2 shows flowchart 200 which describes the steps, according to one embodiment of the invention, in processing a wafer which includes structure 100. Certain details and features have been left out of flowchart 200 which are apparent to a person of ordinary skill in the art, for example, a step may consist of one or more substeps or may involve specialized equipment, as known in the art.

Steps 250 through 260 indicated in flowchart 200 are sufficient to describe one embodiment of the present invention, other embodiments of the invention may use steps different from those shown in flowchart 200. It is noted that the processing steps shown in flowchart 200 are performed on a wafer which, prior to step 250, includes structure 100 shown in FIG. 1. In particular the wafer includes, between two field oxide isolation regions 114 and 115, top surface 104 of collector 102 on which epitaxial deposition of silicon-germanium is to take place.

Figure 3A:
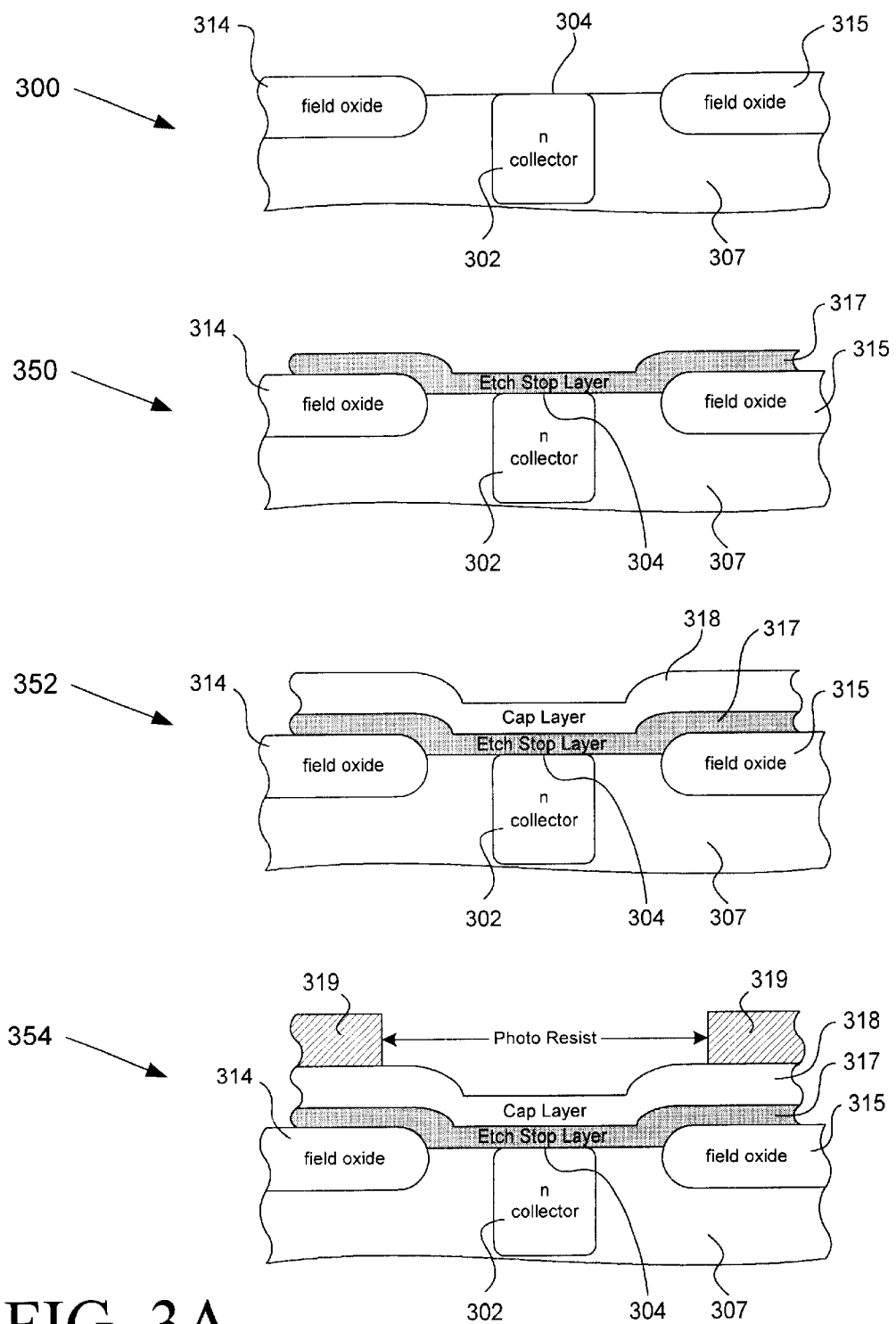
FIG. 3A and FIG. 3B illustrate cross sectional views, which include portions of a silicon wafer processed according to an embodiment of the invention, corresponding to the steps of FIG. 2.

Referring now to FIG. 3A, structure 300 of FIG. 3A shows, in greater detail, a portion of structure 100 of FIG. 1. Field oxide isolation regions 114 and 115, top surface 104 of collector 102, collector 102, and silicon substrate 107 of structure 100 are shown respectively in structure 300 as field oxide isolation regions 314 and 315, top surface 304 of collector 302, collector 302, and silicon substrate 307. For simplicity, other features such as deep trenches 112, buried layer 106, and collector sinker 108 are not shown in structure 300. Structure 300 thus shows the portion of a wafer including, between two field oxide isolation regions 314 and 315, top surface 304 of collector 302 on which epitaxial deposition of silicon-germanium is to take place, before processing the wafer according to one embodiment of the invention as shown in flow chart 200. In particular, structure 300 shows a portion of the wafer before processing step 250 of flowchart 200.

Figure 3B:
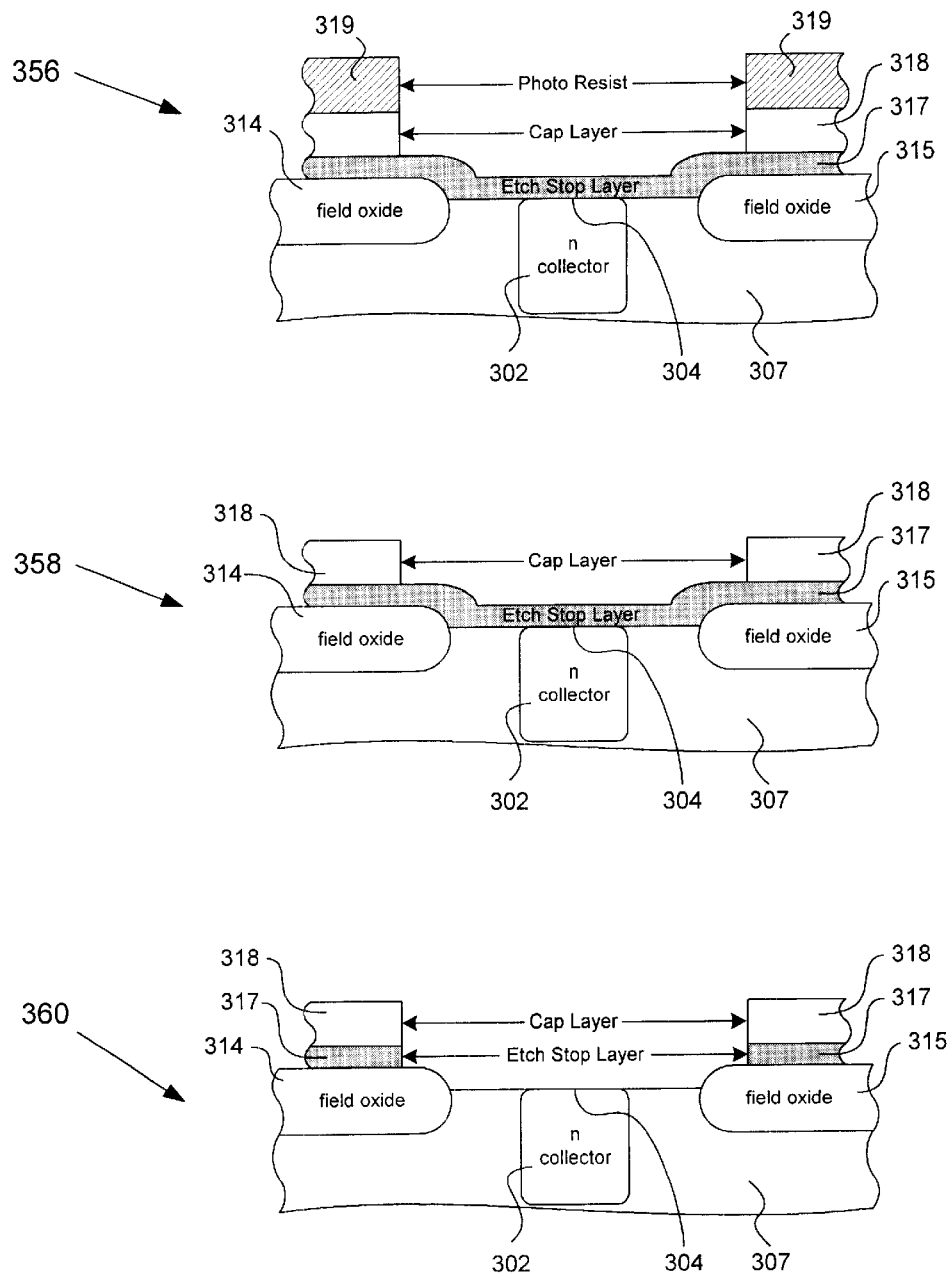

Continuing with FIGS. 3A and 3B, each of structures 350, 352, 354, 356, 358, and 360 of FIGS. 3A and 3B illustrates the result of performing on structure 300 steps 250, 252, 254, 256, 258, and 260, respectively, of flowchart 200 of FIG. 2. For example, structure 350 shows the wafer of structure 300 after the processing of step 250;

structure 352 shows the wafer of structure 350 after the processing of step 252; and so forth.

Although structure 300 shows field oxide isolation regions 314 and 315, for the purposes of processing a wafer according to the steps shown in flowchart 200, field oxide isolation regions 314 and 315 could be other types of isolation. For example, field oxide isolation regions 314 and 315 could instead be shallow trench isolation regions, deep trench isolation, or local oxidation of silicon, generally referred to as "LOCOS." Thus, although the steps of flowchart 200 of FIG. 2 are illustrated in FIGS. 3A and 3B by a wafer with field oxide isolation regions, it is understood that the same steps of flowchart 200 may be applied to a wafer with any type of isolation regions. In addition, it is understood that the same steps of flowchart 200 may be applied to any selected portion of a wafer adjacent to an oxide isolation or to a portion of a wafer between two isolation regions.

Continuing with FIGS. 2 and 3, step 250 of flowchart 200 comprises forming silicon oxide etch stop layer 317 in a manner known in the art over the surface of structure 300, including top surface 304 of collector 302. Silicon oxide etch stop layer 317 provides control for a subsequent etch step in processing the wafer. Referring to FIG. 3A, the result of step 250 of flow chart 200 is illustrated by structure 350. Etch stop layer 317 formed as the result of step 250 is indicated in structure 350 with the words "etch stop layer." Structure 350 of FIG. 3A, then, shows the wafer of structure 300, including top surface 304 of collector 302 on which epitaxial deposition of silicon-germanium is to take place between two field oxide isolation regions 314 and 315, after the addition of silicon oxide etch stop layer 317 in a manner known in the art.

Continuing with FIG. 2, step 252 of flowchart 200 comprises fabricating cap layer 318 over etch stop layer 317 formed in step 250. Accordingly, cap layer 318 covers the surface of structure 350, including top surface 304 of collector 302 and field oxide isolation regions 314 and 315. Cap layer 318 effectively seals the top surface of the wafer and prevents any contaminants from escaping from the top surface of the wafer or from etch stop layer 317. Cap layer 318 is typically in a range of approximately 50 Angstroms to 1000 Angstroms thick. A thinner cap layer may be used depending, for example, on the ability to grow a continuous film for the cap layer without pinholes. A thicker cap layer may be used depending on the practicality of fabricating a thicker cap layer given the surface topography of the silicon wafer.

Cap layer 318 may be composed of, for example, silicon nitride, amorphous silicon, or polycrystalline silicon. Referring to FIG. 3A, the result of step 252 of flowchart 200 is illustrated by structure 352. Cap layer 318 formed as the result of step 252 is indicated in structure 352 with the words "cap layer." Structure 352 of FIG. 3A, then, shows the wafer of structure 350, including top surface 304 of collector 302 on which epitaxial deposition of silicon-germanium is to take place between two field oxide isolation regions 314 and 315, after the addition of cap layer 318.

Continuing with FIG. 2, step 254 of flowchart 200 comprises depositing and patterning photoresist above the surface of structure 352, including top surface 304 of collector 302 and field oxide isolation regions 314 and 315. The purpose of the photoresist depositing and patterning is to pattern cap layer 318 so as to open a "window" onto top surface 304 of collector 302 between field oxide isolation regions 314 and 315. The window will allow for subsequent growth of high quality silicon-germanium crystal by epitaxial deposition on top surface 304 of collector 302 without recontamination. Depending on necessity in fabrication of the HBT or other device, the resulting window may be designed to extend beyond the edges of field oxide isolation regions 314 and 315, as shown in structure 354 of FIG. 3, or the window may fall short of the edges of field oxide isolation regions 314 and 315 (this situation is not shown in any of the Figures).

While step 254 refers to depositing and patterning photoresist for the purpose of patterning cap layer 318 and creating a window, other methods of patterning cap layer 318 could be used, as understood by a person of ordinary skill in the art. Referring to FIG. 3A, the result of step 254 of flow chart 200 is illustrated by structure 354. Photoresist 319 is deposited and patterned in step 254, and is indicated in structure 354 with the word "photoresist." Structure 354 of FIG. 3A, then, shows the wafer of structure 352, including top surface 304 of collector 302 on which epitaxial deposition of silicon-germanium is to take place between two field oxide isolation regions 314 and 315, after the addition and patterning of photoresist 319 on cap layer 318.

Continuing with FIG. 2, step 256 of flowchart 200 comprises etching cap layer 318 of step 254 above the top surface 304 of collector 302 of structure 354. As stated above, the purpose of etching is to open a "window" onto top surface 304 of collector 302 between field oxide isolation regions 314 and 315. The window will allow for subsequent growth of high quality silicon-germanium crystal by epitaxial deposition on top surface 304 of collector 302 without recontamination from various sources such as the surface of field oxide isolation regions 314 and 315.

The etching is done selectively, i.e. an etchant is used which etches cap layer 318 but does not substantially etch silicon oxide etch stop layer 317. Suitable etchants with the desired properties are known in the art. For example, the etch could be a dry etch or a wet etch could be used, for example, to achieve better process control sampling. Referring to FIG. 3B, the result of step 256 of flow chart 200 is illustrated by structure 356. The result of step 256 is indicated in structure 356 by an opening in cap layer 318 of a window corresponding to the photoresist patterned in step 254. Structure 356 of FIG. 3B, then, shows the wafer of structure 354, including top surface 304 of collector 302 on which epitaxial deposition of silicon-germanium is to take place between two field oxide isolation regions 314 and 315, after the opening of a window in cap layer 318 corresponding to the prior patterning step 254.

Continuing with FIG. 2, step 258 of flowchart 200 comprises removing or stripping photoresist 319 of step 256. The purpose of stripping photoresist 319 is to prepare the wafer for further processing steps. Because photoresist 319 is no longer needed, it is removed before further processing of the wafer. Although photoresist 319 has been used to pattern cap layer 318, it will be apparent to a person of ordinary skill in the art that other methods of patterning could have been used, and that, therefore, step 258 could be eliminated or modified accordingly. Referring to FIG. 3B, the result of step 258 of flowchart 200 is illustrated by structure 358. The result of step 258 is indicated in structure 358 by opened cap layer 318 free of photoresist 319, ready for further processing of the wafer. Structure 358 of FIG. 3B, then, shows the wafer of structure 356, including top surface 304 of collector 302 on which epitaxial deposition of silicon-germanium is to take place between two field oxide isolation regions 314 and 315, after the opening of a window in cap layer 318 and removal of photoresist 319.

Continuing with FIG. 2, step 260 of flowchart 200 comprises removing silicon oxide etch stop layer 317 from top surface 304 of collector 302 of structure 358. The removal of silicon oxide etch stop layer 317 can be accomplished in a manner known in the art, such as by using a wet, dry, or vapor clean process. The purpose of removing etch stop layer 317 is to prepare the wafer for epitaxial deposition of silicon-germanium. After the removal of etch stop layer 317, there may be some residual contaminants on silicon top surface 304. The residual contaminants are removed either with the same process used to remove silicon oxide etch stop layer 317 or with a different process. For example, the residual contaminants could be removed using a high temperature hydrogen bake, as discussed above. After the hydrogen bake, top surface 304 is ready for epitaxial deposition of silicon-germanium. Referring to FIG. 3B, the result of step 260 of flow chart 200 is illustrated by structure 360. The result of step 260 is indicated in structure 360 by an opening in cap layer 318 and silicon oxide etch stop layer 317. Top surface 304 of collector 302 is exposed and ready for processing in preparation for epitaxial deposition of silicon-germanium. Structure 360 of FIG. 3B, then, shows the wafer of structure 358, including top surface 304 of collector 302 between two field oxide isolation regions 314 and 315, which is ready for preparation for epitaxial deposition of silicon-germanium.

Figure 4:
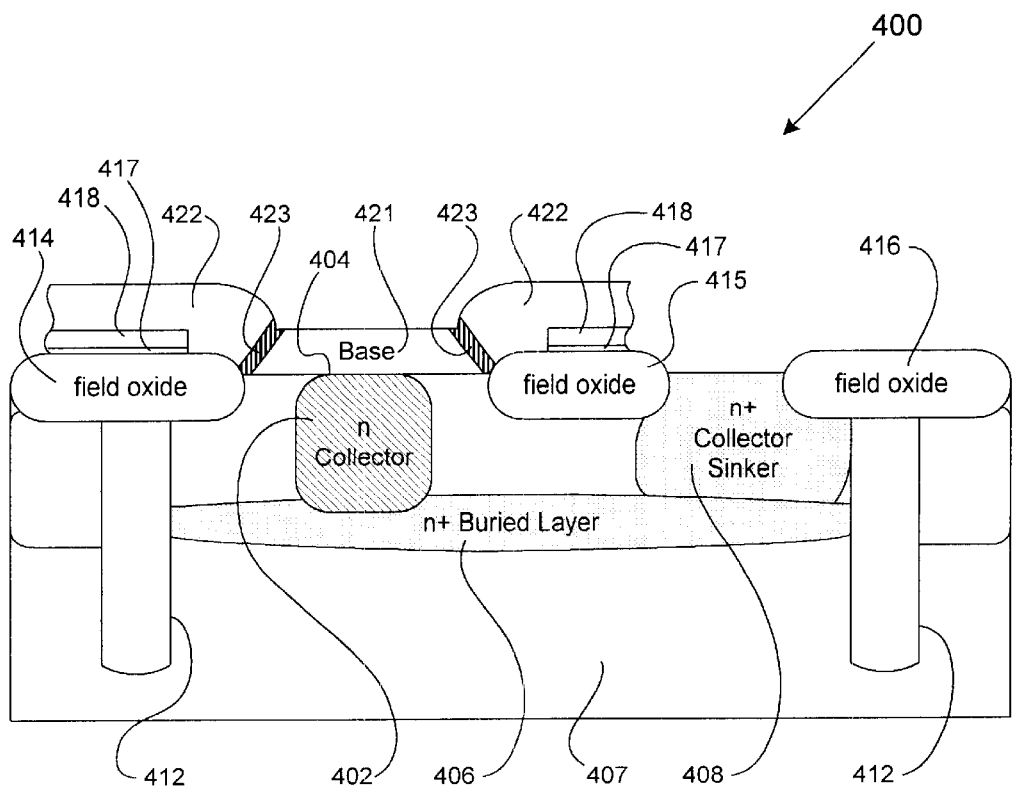
FIG. 4 illustrates a cross sectional view of some of the features of an NPN HBT fabricated in accordance with one embodiment of the present invention.

FIG. 4 shows structure 400, which illustrates structure 100 of FIG. 1 subsequent to step 260 of flow chart 200 and after epitaxial deposition, in a nonselective RPCVD process, of single crystal silicon-germanium. In particular, features and components 102, 104, 106, 107, 108, 112, 114, 115, and 116 of structure 100 of FIG. 1 are shown respectively as features and components 402, 404, 406, 407, 408, 412, 414, 415, and 416 of structure 400 of FIG. 4. In addition, etch stop layer 317 and cap layer 318 of structure 360 of FIG. 3B are shown respectively in structure 400 of FIG. 4 as etch stop layer 417 and cap layer 418. Thus, FIG. 4 shows structure 400 subsequent to step 260 of flow chart 200 and after epitaxial deposition, in a nonselective RPCVD process, of single crystal silicon-germanium base 421 of the NPN HBT on top surface 404 of collector 402.

Because the epitaxial deposition of silicon-germanium is nonselective, structure 400 also shows the deposition of polycrystalline base contact 422 having interface 423 with base 421. Polycrystalline base contact 422 is deposited above cap layer 418, etch stop layer 417, and field oxide isolation regions 414 and 415.

FIG. 4 shows structure 400 after epitaxial deposition, in an RPCVD process, of single crystal silicon-germanium base of the NPN HBT. As discussed above, the higher gain, speeds, and frequency response of the HBT have been achieved as a result of certain advantages of silicon-germanium not available with pure silicon. For example, the higher speeds and frequency response of the HBT have been achieved as a result of taking advantage of the narrow band gap for silicon-germanium. The energy band gap of silicon-germanium is smaller than it is for silicon, lying between the intrinsic band gap of silicon (1.12 eV) and germanium (0.66 eV). The band gap is reduced further by the "compressive strain" in the silicon-germanium alloy layer, with the band gap being reduced even further with increasing germanium content. The benefits of compressive strain in the alloy layer can be destroyed, however, by relaxation of the strain due to crystal dislocations. Crystal dislocations in the alloy layer can be caused by the presence of contaminants on the underlying silicon crystal layer. Therefore, the added considerations imposed by, for example, maintaining strain in the alloy layer increase the demand for control and removal of contaminants prior to silicon-germanium crystal growth by epitaxial deposition.

Previously, the hydrogen bake used to remove residual contamination from the silicon surface prior to epitaxial deposition permitted an opportunity for migration, during the hydrogen bake, of contaminants from sources such as the exposed surfaces of oxide isolation regions onto the silicon surface. In other words, there was recontamination of the silicon surface from the isolation regions and other exposed areas of the wafer just prior to epitaxy on the silicon surface. The recontamination prior to epitaxy caused defects in the epitaxial growth on the order of 10 defects per square micron of crystal area. The addition, according to one embodiment of the present invention, of cap layer 318 over the field oxide isolation regions and other exposed areas of the wafer substantially prevents recontamination prior to epitaxy. The number of defects due to recontamination prior to epitaxy is reduced virtually to zero. According to the present embodiment of the invention, the yield of the semiconductor wafer is significantly increased due to the effectiveness of the invention's control of contamination.

It is appreciated by the above detailed disclosure that the invention provides a method for elimination of contaminants prior to epitaxial growth. Although the invention is described as applied to the construction of a heterojunction bipolar transistor, it will be readily apparent to a person of ordinary skill in the art how to apply the invention in similar situations where preparation is needed for single crystal silicon-germanium growth or even single crystal silicon-only growth.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for reducing contamination prior to epitaxial growth and related structure have been described.

What is claimed is:

1. A method comprising steps of:
    forming an etch stop layer over a surface of a wafer fabricating a cap layer over said etch stop layer;
    selectively etching said cap layer without etching said etch stop layer;
    removing said etch stop layer and cleaning said surface of said wafer;
    epitaxially growing a semiconductor on said surface of said wafer.

2. The method of claim 1 wherein said etch stop layer comprises silicon oxide.

3. The method of claim 1 wherein said cap layer comprises material selected from the group consisting of silicon nitride, amorphous silicon, and polycrystalline silicon.

4. The method of claim 1 further comprising a step of depositing and patterning a photoresist layer prior to said step of selectively etching said cap layer.

5. The method of claim 4 further comprising a step of stripping said photoresist layer after said step of selectively etching said cap layer.

6. The method of claim 1 wherein said step of epitaxially growing said semiconductor comprises epitaxially growing silicon-germanium on said surface of said wafer.

7. The method of claim 1 wherein said surface of said wafer comprises a single crystal silicon collector and wherein said step of epitaxially growing said semiconductor comprises epitaxially growing a single crystal silicon-germanium base on said collector.

8. The method of claim 7 wherein said step of removing said etch stop layer and cleaning said surface of said wafer comprises removing said etch stop layer from said collector and cleaning a surface of said collector prior to epitaxially growing said base on said collector.

9. A method comprising steps of:
    fabricating a single crystal silicon collector between first and second isolation regions;
    depositing an etch stop layer and a cap layer over said single crystal silicon collector;
    etching a window in said etch stop layer and said cap layer so as to expose and clean a surface of said collector;
    epitaxially growing a single crystal silicon-germanium base on said surface of said collector.

10. The method of claim 9 wherein said etch stop layer comprises silicon oxide.

11. The method of claim 9 wherein said cap layer comprises material selected from the group consisting of silicon nitride, amorphous silicon, and polycrystalline silicon.

12. The method of claim 9 further comprising a step of depositing and patterning a photoresist layer prior to said step of etching said window.

13. The method of claim 9 wherein said first and second isolation regions comprise field oxide isolation regions.

14. The method of claim 9 wherein said first and second isolation regions comprise LOCOS isolation regions.

15. The method of claim 9 wherein said first and second isolation regions comprise shallow trench isolation regions.

16. The method of claim 9 wherein said first and second isolation regions comprise deep trench isolation regions.

* * * * *